United States Patent [19]

Ishikawa

[11] Patent Number: 5,275,958
[45] Date of Patent: Jan. 4, 1994

[54] METHOD FOR PRODUCING SEMICONDUCTOR CHIPS

[75] Inventor: Takahide Ishikawa, Itami, Japan

[73] Assignee: Mitsubishi Denki Kabushiki Kaisha, Tokyo, Japan

[21] Appl. No.: 4,058

[22] Filed: Jan. 13, 1993

[30] Foreign Application Priority Data

Jan. 23, 1992 [JP] Japan .................. 4-010020

[51] Int. Cl.⁵ ........................... H01L 21/302
[52] U.S. Cl. .................... 437/226; 437/228; 437/243; 437/974; 148/DIG. 50; 148/DIG. 135; 148/DIG. 28
[58] Field of Search ............... 437/226, 228, 243, 974, 437/227; 148/DIG.; 16.136; 16.28; 16.50

[56] References Cited

U.S. PATENT DOCUMENTS

| 4,851,366 | 7/1989 | Blanchard | 437/228 |
| 4,978,639 | 12/1990 | Hua et al. | 148/DIG. 135 |
| 5,071,792 | 12/1991 | Van Vonns et al. | 437/974 |
| 5,185,292 | 2/1993 | Van Vonno et al. | 437/226 |
| 5,204,282 | 4/1993 | Truruta et al. | 437/974 |

FOREIGN PATENT DOCUMENTS 2058660 3/1987 Japan .................. 437/226

Primary Examiner—Brian E. Hearn
Assistant Examiner—Kevin M. Picardat
Attorney, Agent, or Firm—Leydig, Voit & Mayer

[57] ABSTRACT

According to a method for producing semiconductor chips, first grooves are formed in a semiconductor wafer at a front surface, dividing the semiconductor water into a plurality of regions, each region including a single device or an integrated circuit; a first metallization layer is formed in the first grooves; the semiconductor wafer is thinned to a desired thickness from the rear surface of the wafer; second grooves are formed in the semiconductor wafer at the rear surface at positions opposite the first grooves, exposing the first metallization layer; a second metallization layer is formed in the second grooves; a metal layer for heat radiation is formed on the rear surface of the wafer but not on the second metallization layer; and the first and second metallization layers in the first grooves are cut with a dicing blade to produce a plurality of semiconductor chips. Burrs of the metallization layers caused by the dicing are small and never protrude beyond the rear surface of the chip, resulting in a reliable junction between the chip and a mounting substrate in a subsequent die-bonding process.

4 Claims, 4 Drawing Sheets

METHOD FOR PRODUCING SEMICONDUCTOR CHIPS

FIELD OF THE INVENTION

The present invention relates to a method for producing high power semiconductor devices and, more particularly, to a method for dividing a semiconductor wafer into chips.

BACKGROUND OF THE INVENTION

FIG. 3(a) is a plan view illustrating a semiconductor wafer in which a plurality of ICs are formed in chequerboard pattern, and FIG. 3(b) is a cross section of a portion of FIG. 3(a). A surface protection film 11 is disposed on each chip region 10 containing an IC. Regions 12 where the surface protection films 11 are absent are dicing lines.

FIG. 4 illustrates a semiconductor wafer used in production of high output semiconductor devices. In FIG. 4, the wafer 1 is as thin as 20~30 microns and a plated heat sink (hereinafter referred to as PHS) 20 comprising Au or the like and having a thickness of 40~60 microns is disposed on the rear surface of the wafer 1 to improve heat radiation of the device. In production of usual devices, the PHS 20 is present except for regions opposite to the dicing lines 12. In case of high powered output devices, however, since the wafer is thin for the reason described above, the PHS 20 covers all the rear surface of the wafer 1 to prevent ICs contained in the wafer from being damaged by warping of the wafer which is caused by a difference in expansion coefficients between the wafer and the PHS.

A method for dividing the semiconductor wafer of FIG. 4 into chips by dicing is illustrated in FIGS. 5(a)-5(c).

Initially, as illustrated in FIG. 5(a), a dicing tape 40 is attached to the rear surface of the PHS 20. Then, as illustrated in FIG. 5(b), a dicing saw 30 cuts the wafer 1 along the dicing line 12. The dicing is carried out along all dicing lines 12 until the tip of the dicing saw 30 reaches into the dicing tape 40, whereby the wafer 1 is divided into chips as shown in FIG. 5(c). At this time, a burr 21 20~30 microns long is produced on the rear surface of the chip due to the ductility of the PHS 20.

After removing the dicing tape 40, each chip is bonded to a mount substrate 50 with solder 60 as shown in FIG. 6. Since the burr 21 protrudes from the rear surface of the chip, the solder 60 is not favorably adhered to the entire surface of the PHS 20, resulting in a faulty assembly.

SUMMARY OF THE INVENTION

It is an object of the present invention to provide a method for producing semiconductor chips in which burrs caused by dicing do not adversely affect the subsequent diebonding process.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to a first aspect of the present invention, in a method for producing semiconductor chips, first grooves are formed in a semiconductor wafer at a front surface of the semiconductor wafer, dividing the semiconductor wafer into a plurality of regions each region including a single device or an integrated circuit, first metallization layers are formed in the first grooves, the semiconductor wafer is thinned to a desired thickness from the rear surface of the wafer, second grooves are formed in the semiconductor wafer at the rear surface of the semiconductor wafer at positions opposite the first grooves so that the bottom surfaces of the first metallization layers are exposed, second metallization layers are formed in the second grooves, metal layers for heat radiation are formed on the rear surface of the wafer but not on the second metallization layers, and the first and second metallization layers in the first grooves are cut with a dicing blade to produce a plurality of semiconductor chips.

According to the second aspect of the present invention, in a method for producing semiconductor chips, first grooves are formed in a semiconductor wafer at a front surface of a semiconductor wafer, diving the semiconductor wafer into a plurality of regions each region including a single device or an integrated circuit, first metallization layers are formed in the first grooves, the semiconductor wafer is thinned to a thickness thicker than a desired thickness from the rear surface of the wafer, second grooves are formed in the semiconductor wafer at the rear surface of the semiconductor wafer at positions opposite the first grooves so that the bottom surfaces of the first metallization layers are exposed, second metallization layers are formed in the second grooves, portions of the second metallization layers on the rear surface of the wafer are removed and the wafer is thinned to the desired thickness, metal layers for heat radiation are formed on the rear surface of the wafer but not on the second metallization layers, and the first and second metallization layers in the first grooves are cut with a dicing blade to produce a plurality of semiconductor chips.

In these methods, the first and second metallization layers are much thinner than the semiconductor chip, burrs of the metallization layers caused by the dicing never protrude over the rear surface of the chip and never adversely affect the subsequent die-bonding process.

DETAILED DESCRIPTION OF THE PREFERRED EMBODIMENTS

Figure 5A:
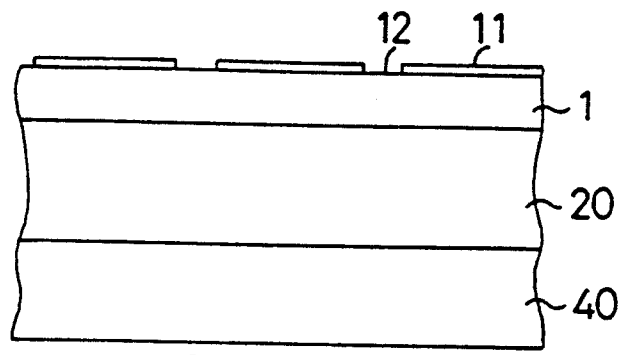
FIGS. 5(a) to 5(c) are cross-sectional views illustrating a method for producing semiconductor chips in accordance with the prior art.
Figure 5B:
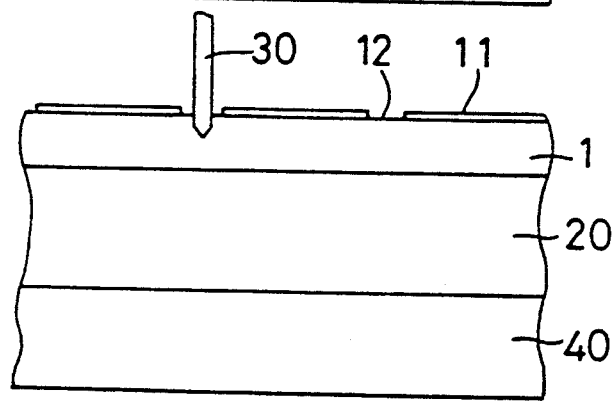
Figure 5C:
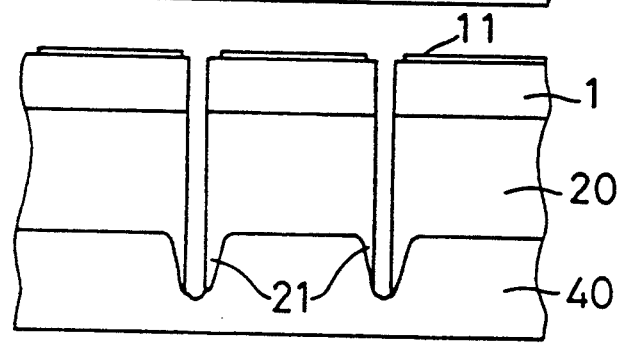
Figure 6:
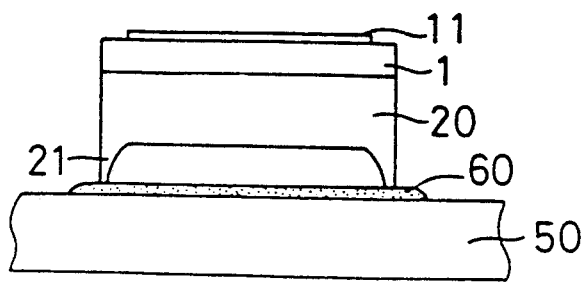
FIG. 6 is a side view illustrating a semiconductor chip produced according to the method of FIGS. 5(a)-5(c), which is bonded on a mount substrate.

FIGS. 1(a)-1(h) are cross-sectional views illustrating a method for producing semiconductor chips in accordance with a first embodiment of the present invention. In the figures, the same reference numerals as in FIGS. 5(a)-5(c) designate the same or corresponding parts. Reference numerals 2 and 4 designate chip separating grooves covered with metallization layers 3 and 5, respectively. Reference numeral 6 designates a PHS disposed on the rear surface of the substrate 1. Reference numeral 7 designates burrs of the metallization layers 3 and 5. Reference numeral 8 designates a glass plate and numeral 9 designates wax. In addition; the size of the groove 2 and its vicinity is made larger in the drawing than actual size for easy understanding.

A description is given of the production method.

Figure 1A:
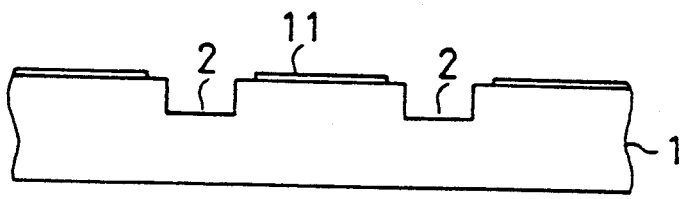
FIGS. 1(a) to 1(h) are cross-sectional views illustrating a method for producing semiconductor chips according to a first embodiment of the present invention.

First of all, a GaAs substrate 1 about 600 microns thick, in which desired components or circuits have been produced, is prepared. Then, as illustrated in FIG. 1(a), portions of the GaAs substrate 1 are selectively removed by wet or dry etching to form first chip separating grooves 2 5~15 microns deep.

Figure 1B:
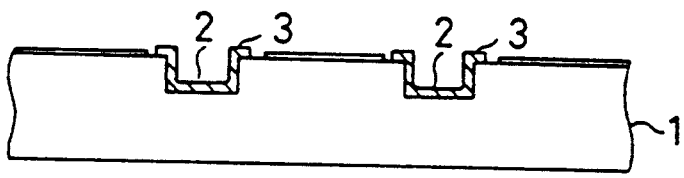

As illustrated in FIG. 1(b), the inside of the first grooves 2 are metallized using conventional Au plating method, forming first metallization layers 3 about 10 microns thick.

Figure 1C:
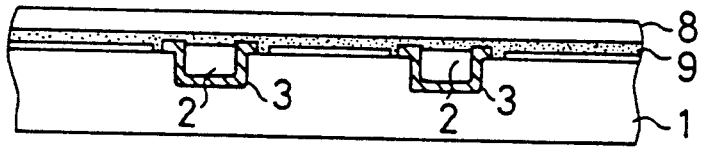
Figure 1D:
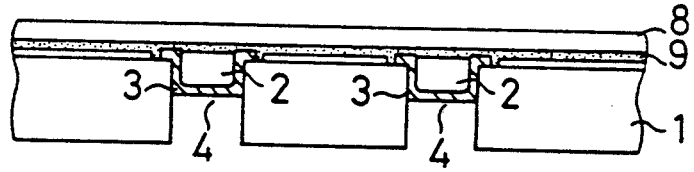

As illustrated in FIG. 1(c), a glass plate 8 is adhered to the upper surface of the substrate 1 using wax 9, and the substrate 1 is thinned from the rear surface by polishing or the like to a thickness a little thicker than a desired thickness. Then, as illustrated in FIG. 1(d), portions of the substrate 1 opposite to the first grooves 2 are selectively etched by wet or dry etching until the metallization layers 3 are exposed, forming second chip separating grooves 4.

Figure 1E:
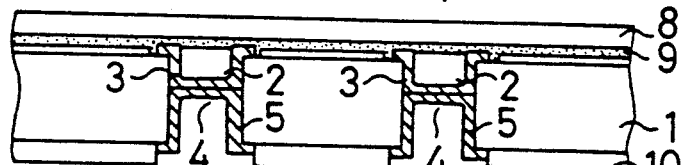

Thereafter, as illustrated in FIG. 1(e), photoresist films 10 are selectively formed on the rear surface of the substrate 1 except for the second grooves 4, and the inside of the second grooves 4 are metallized using a conventional Au plating method using the photoresist films 10 as a mask, forming second metallization layers 5 about 10 microns thick which increase the strength of the wafer. At this time, the metallization layers 5 extend onto the rear surface of the substrate 1 because of the limit of precision in the formation of the photoresist films 10.

Figure 1F:
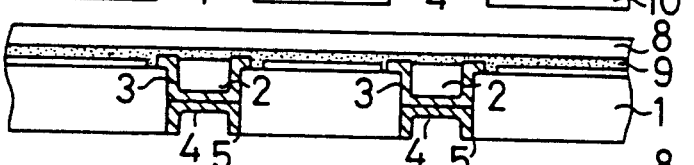

After removing the photoresist films 10, as illustrated in FIG. 1(f), portions of the metallization layers 5 extending on the rear surface of the substrate 1 are removed by polishing while reducing the thickness of the substrate 1 to the desired thickness, i.e., 20~30 microns.

Figure 1G:
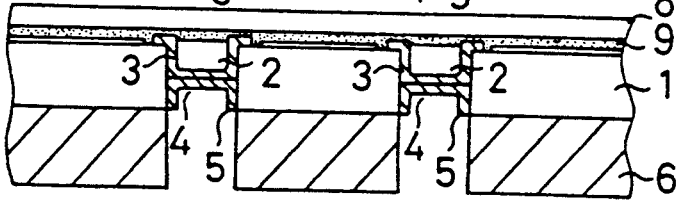

Thereafter, as illustrated in FIG. 1(g), PHS layers 6 40~60 microns thick are selectively formed on the rear surface of the GaAs substrate 1 except for the second metallization layers 5. Even if the PHS 6 is formed in contact with the metallization layer 5, since the element production region of the substrate 1 is covered with the surface protection film 11 and is not in contact with the metallization layer 3, no leakage occurs.

Figure 1H:
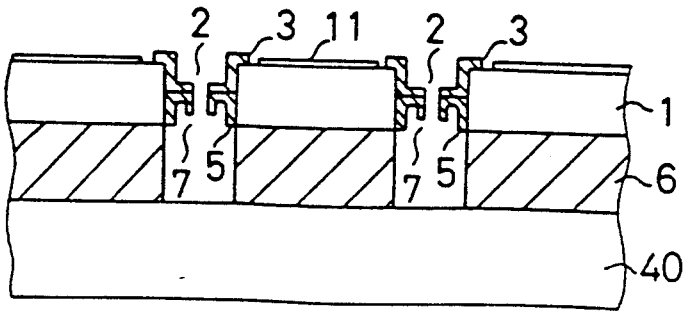

Then, as illustrated in FIG. 1(h), the glass plate 8 is removed from the wafer by melting the wax 9, and dicing is carried out with a dicing tape 40 attached to the rear surface of the wafer, to separate the chips from each other. Since the metallization layers 3 and 5 connecting the respective chips to each other are about 20 microns thick in total, a burr 7 caused by the dicing is only 10 microns in size, which is significantly smaller than the thickness of the chip with the PHS 6. Therefore, the burr 7 never protrudes over the rear surface of the chip, with a result that a reliable junction is achieved between the chip and a mounting substrate in the subsequent die-bonding process.

According to the first embodiment of the present invention, the strength of the wafer before dicing is maintained by the metallization layers 3 and 5. In addition, since the metallization layers 3 and 5, which connect the chips in the wafer to each other, are cut during dicing, the burr of the metallization layers caused by the dicing is small and does not protrude over the rear surface of the chip, resulting in a reliable junction in the subsequent die-bonding process.

FIGS. 2(a)-2(g) are cross-sectional views illustrating a method for producing semiconductor chips in accordance with a second embodiment of the present invention. This method is different from the above-described method of the first embodiment only in that portions of the second metallization layers 5 extending on the rear surface of the substrate 1 are not removed and the PHS 6 is formed thereon.

A description is given of the production method.

Figure 2A:
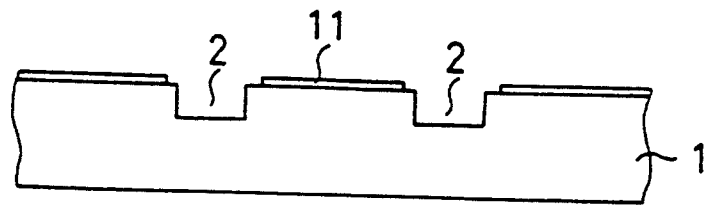
FIGS. 2(a) to 2(g) are cross-sectional views illustrating a method for producing semiconductor chips according to a second embodiment of the present invention.
Figure 2B:
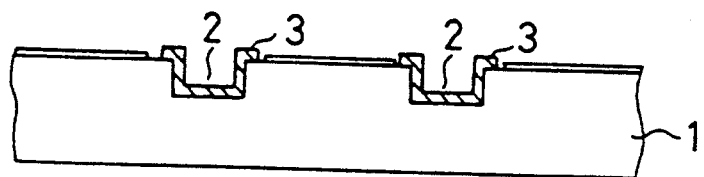

Steps illustrated in FIGS. 2(a) and 2(b) are identical to the steps already described with respect to FIGS. 1(a) and 1(b) and, therefore, repeated description is not necessary.

Figure 2C:
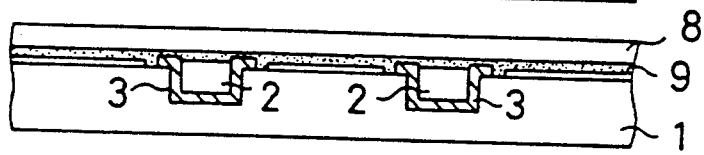

Turning to FIG. 2(c), a glass plate 8 is adhered to the upper surface of the substrate 1 using wax 9, and the substrate 1 is thinned a desired thickness. Preferably, the thickness is 20~30 microns.

Figure 2D:
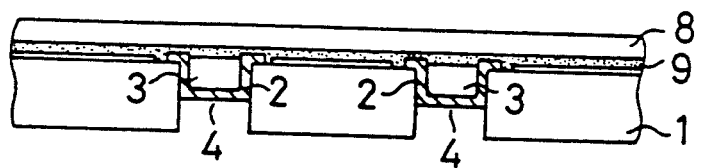

As illustrated in FIG. 2(d), portions of the substrate 1 opposite to the first grooves 2 are removed by wet or dry etching to expose the metallization layers 3, forming second chip separating grooves 4.

Figure 2E:
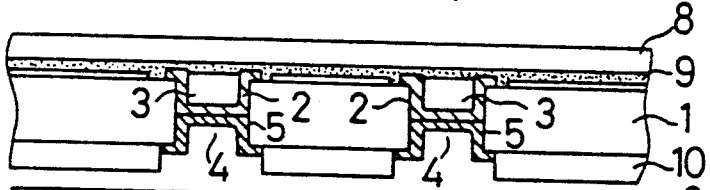

As illustrated in FIG. 2(e), photoresist films 10 are selectively formed on the rear surface of the substrate 1 except for the second grooves 4, and the insides of the second grooves 4 are metallized using a conventional Au plating method, forming second metallization layers 5 about 10 microns thick which increase the strength of the wafer. At this time, the metallization layers 5 extend onto the rear surface of the substrate 1 because of the limit of precision in forming the photoresist films 10.

Figure 2F:
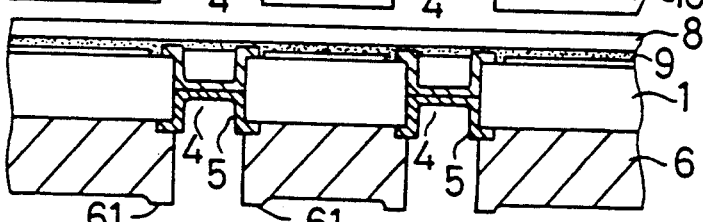
Figure 2G:
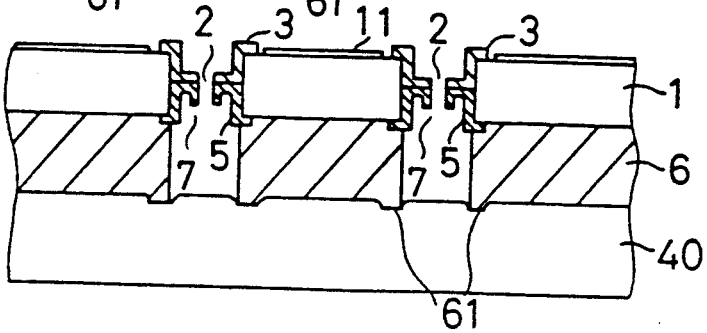
Figure 3A:
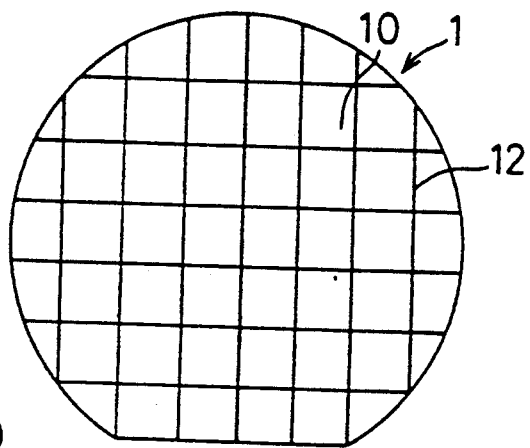
FIGS. 3(a) and 3(b) are a plan view and a cross-sectional view illustrating a semiconductor wafer before dicing according to the prior art.
Figure 3B:
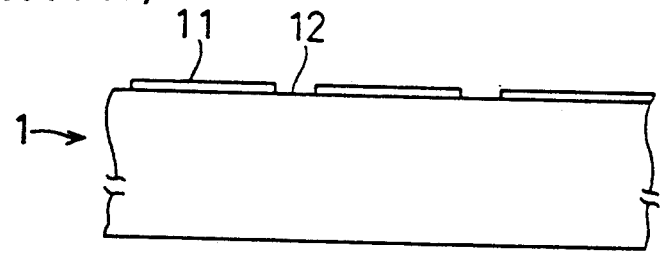
Figure 4:
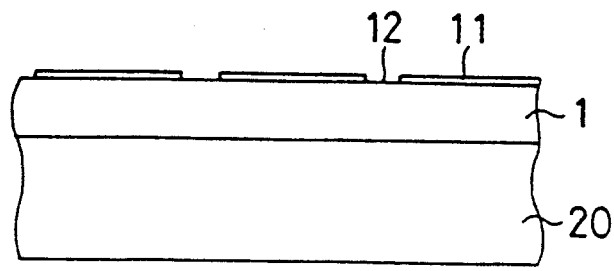
FIG. 4 is a cross-sectional view illustrating a semiconductor wafer provided with a PHS according to the prior art.

As illustrated in FIG. 2(f), the photoresist films 10 are removed and PHS layers 6 40~60 microns thick are selectively formed on the rear surface of the GaAs substrate 1 except for the second metallization layers 5. At this time, projections 61 are on the rear surface of the PHS 6 are as high as the portions of the metallization layers 5 remaining on the rear surface of the substrate 1.

As illustrated in FIG. 1(g), the glass plate 8 is removed from the wafer by melting the wax 9, and dicing is carried out with a dicing tape 40 attached to the rear surface of the wafer to separate the chips from each other.

According to the second embodiment of the present invention, since the step of removing the portions of the second metallization layers 5 extending onto the rear surface of the substrate can be dispensed with, the production is simplified as compared with the first embodiment. Although a projection 61 of about 10 microns in size is formed on the rear surface of the chip, it does not become a large obstacle during die-bonding process when a very high precision in assembly is not required.

While in the above-described first and second embodiments GaAs is employed as the material of the substrate 1, the present invention can also be applied to cases where other semiconductor materials, such as AlGaAs, InP, Si, and the like are employed with the same effects as described above.

While in the above-described first and second embodiments gold is employed as the material of the metallization layers 3 and 5, a metal having a lower ductility than gold, for example, nickel, may be employed, further reducing the size of the burrs.

As is evident from the foregoing description, in a method for producing semiconductor chips according to the present invention, first grooves are formed in a semiconductor wafer at a front surface of a semiconductor wafer, dividing the semiconductor wafer into a plurality of regions each region including a single device or an integrated circuit, and first metallization layers are formed in the first grooves. Second grooves are formed in the semiconductor wafer at the rear surface of the semiconductor wafer at positions opposite to the first grooves so that the bottom surfaces of the first metallization layers are exposed, and second metallization layers are formed in the second grooves. Thus, the wafer is divided into a plurality of chips connected to each other by the first and second metallization layers. Then, the metallization layers in the first grooves are cut with a dicing blade to separate the chips from each other. Burrs of the metallization layer caused by the dicing are small and never protrude over the rear surface of the chip, resulting in a reliable junction between the chip and a mounting substrate in a subsequent die-bonding process.

What is claimed is:

1. A method for producing semiconductor chips comprising:

forming first grooves in a semiconductor wafer at a front surface of the semiconductor wafer, dividing the semiconductor water into a plurality of regions, each region including at least a single device;

forming a first metallization layer in the first grooves;

thinning the semiconductor wafer to a desired thickness from a rear surface, opposite the front surface, of the semiconductor wafer;

forming second grooves in the semiconductor wafer at the rear surface of the semiconductor wafer at positions opposite the first grooves so that the first metallization layer is exposed;

forming a second metallization layer in the second grooves;

forming a metal layer for heat radiation on the rear surface of the semiconductor wafer but not on the second metallization layer; and cutting through the first and second metallization layers in the first grooves with a dicing blade to produce a plurality of semiconductor chips.

2. The method of claim 1 including adhering the semiconductor wafer at the front surface to a supporting plate after forming the first metallization layer and before thinning the wafer and removing the supporting plate after forming the metal layer for heat radiation and before cutting through the first and second metallization layers.

3. A method for producing semiconductor chips comprising:

forming first grooves in a semiconductor wafer at a front surface of the semiconductor wafer, dividing the semiconductor water into a plurality of regions, each region including at least a single device;

forming a first metallization layer in the first grooves;

thinning the semiconductor wafer to a thickness thicker than a desired thickness from a rear surface, opposite the front surface, of the semiconductor wafer;

forming second grooves in the semiconductor wafer at the rear surface of the semiconductor wafer at positions opposite the first grooves so that the first metallization layer is exposed;

forming a second metallization layer in the second grooves;

removing portions of the second metallization layer from the rear surface of the semiconductor wafer and thinning the semiconductor wafer to the desired thickness;

forming a metal layer for heat radiation on the rear surface of the semiconductor wafer but not on the second metallization layer; and cutting through the first and second metallization layers in the first grooves with a dicing blade to produce a plurality of semiconductor chips.

4. The method of claim 3 including adhering the semiconductor wafer at the front surface to a supporting plate after forming the first metallization layer and before thinning the wafer and removing the supporting plate after forming the metal layer for heat radiation and before cutting through the first and second metallization layers.

* * * * *

UNITED STATES PATENT AND TRADEMARK OFFICE
CERTIFICATE OF CORRECTION

PATENT NO. : 5,275,958
DATED : January 4, 1994
INVENTOR(S) : Takahide Ishikawa

It is certified that error appears in the above-indentified patent and that said Letters Patent is hereby corrected as shown below:

On the title page:
 In Item [56], References Cited, change "Van Vonns" to --Van Vonno--.
 Col. 5, line 37, change "water" to --wafer--.
 Col. 6, line 18, change "water" to --wafer--.

Signed and Sealed this

Ninth Day of August, 1994

Attest:

BRUCE LEHMAN

Attesting Officer  Commissioner of Patents and Trademarks